United States Patent [19]

Sirinyan et al.

[11] Patent Number: 4,554,183

[45] Date of Patent: Nov. 19, 1985

[54] PROCESS FOR PRETREATING POLYAMIDE SUBSTRATES FOR ELECTROLESS METALLIZATION

[75] Inventors: Kirkor Sirinyan, Bergisch Gladbach; Gerhard D. Wolf, Dormagen; Rudolf Merten; Ulrich von Gizycki, both of Leverkusen, all of Fed. Rep. of Germany

[73] Assignee: Bayer Aktiengesellschaft, Leverkusen, Fed. Rep. of Germany

[21] Appl. No.: 665,799

[22] Filed: Oct. 29, 1984

[30] Foreign Application Priority Data

Nov. 4, 1983 [DE] Fed. Rep. of Germany ....... 3339857

[51] Int. Cl.$^4$ .............................................. B05D 3/10
[52] U.S. Cl. .................................... 427/306; 427/304
[58] Field of Search .............................. 427/304, 306

[56] References Cited

U.S. PATENT DOCUMENTS 4,493,861  1/1985  Sirinyan et al. ..................... 427/304

FOREIGN PATENT DOCUMENTS 0081129  6/1983  European Pat. Off. .

Primary Examiner—James R. Hoffman
Attorney, Agent, or Firm—Sprung, Horn, Kramer & Woods

[57] ABSTRACT

A mild activation process for the electroless metallization of polyamide mouldings comprises treating the mouldings with a solution of a mixture of halides of elements of the 1st and 2nd main group of the Periodic Table (for example $CaCl_2$) with salts of weak inorganic bases and strong inorganic acids (for example $AlCl_3$) in a swelling agent or solvent for polyamides and with a metal-organic complex compound of elements of the 1st or 8th sub-group of the Periodic Table. The sequence is here immaterial.

10 Claims, No Drawings

PROCESS FOR PRETREATING POLYAMIDE SUBSTRATES FOR ELECTROLESS METALLIZATION

The invention relates to a relatively mild process for pretreating substrate surfaces of synthetic polyamide mouldings for producing strongly adhering metal coatings by means of metallisation by chemical deposition.

It is generally known that the pretreatment, conventional for numerous plastic articles, by etching with strongly oxidising acids is unsuitable for polyamide substrates.

Proposals have therefore already been made (compare DE-A 2,946,343) first to pretreat the polyamide substrate at an elevated temperature with an aqueous alkaline solution having a pH value of at least about 10, before it is etched with an organic acid. For the last step, trichloroacetic acid and trifluoroacetic acid were preferably used, the handling of which requires expensive occupation health measures because of their volatility and high toxicity. Furthermore, this still very drastic pretreatment method causes an irreversible deterioration in the most important mechanical properties of the polyamide mouldings.

According to DE-A 3,137,587, attempts are made to eliminate these disadvantages by pretreating the polyamide substrates with a mixture of water-containing acid and a water-soluble organic solvent having a swelling action on the polyamides. It was found, however, that even this etching process damages the polyamide mouldings to such an extent that the latter cannot be used for numerous purposes.

DE-A 2,022,109 describes a process for pretreating plastic mouldings to be metallised, which is characterised in that the plastic is treated, in a solvent which (incipiently) dissolves or incipiently swells it, with a dissolved metal salt complex. As a plastic, polyamide is also mentioned. The complex salts are essentially complexes of dimethyl sulphoxide with $LiCl$, $SnCl_2$, $ZnCl_2$, $FeCl_2$, $FeCl_3$, $Hg_2Cl_2$, $MnCl_2$, $AgNO_3$, and others. By way of example, only a silver nitrate solution containing ammonia is described as the activator solution. In repeating this method, however, only metal deposits of insufficient adhesive strength were obtained. Moreover, the substrates activated with $AgNO_3$ also frequently cause a breakdown of the metallisation baths.

Finally, EP-A 0,081,129 (Examples 11 and 12) has disclosed a process for pretreating the amide materials, wherein the substrate is first degreased with sodium hydroxide solution, then activated with an activation solution which contains methanol (and, if appropriate, methylene chloride) $CaCl_2$ and a palladium/olefine dichloride complex and, after rinsing with methanol and drying, is introduced into a metallising bath using an electroless process.

This really quite elegant method has, however, the disadvantage that it requires a relatively large number of process steps and that the metal coatings deposited do not meet the stringent requirements of the thermal cycling test according to DIN 53,496.

It has now been found, surprisingly, that these disadvantages can be largely avoided and well adhering metal coatings on polyamide substrates can be obtained, without adversely affecting their mechanical properties, such as notched impact strength, impact resistance and mechanical strength, when the substrates are treated, in any desired sequence, with (a) a solution of a mixture of halides of elements of the 1st and/or 2nd main group of the Periodic Table with salts of weak inorganic bases and strong inorganic acids in a non-etching organic swelling agent or solvent for polyamides and (b) a metal-organic complex compound of elements of the 1st and/or 8th sub-group of the Periodic Table.

Suitable halides of elements of the 1st and 2nd main group are in particular the chlorides; $LiCl$, $BeCl_2$, $MgCl_2$ and $CaCl_2$ are preferred.

Suitable salts of weak bases and strong acids are the sulphates, nitrates and above all the chlorides of metals of the 3rd and 4th main groups and sub-groups, and also of base metals of the 6th-8th sub-group. $FeCl_2$, $FeCl_3$, $TiCl_3$, $TiCl_4$, $BCl_3$ and in particular $AlCl_3$ are preferred.

Suitable swelling agents and solvents are those described in common handbooks on polyamides (compare, for example, "Die Polyamide [The Polyamides]" by Hopff, Müller and Wegner, Springer-Verlag (1954), and "Polymer Handbook" by Brandrup et al., New York, Volume IV (1975), and "Kunststoffhandbuch [Plastics Handbook]" by Vieweg/Müller; Volume IV (1966). By way of example, the following may be mentioned: lower aliphatic and araliphatic alcohols, such as, for example, methanol, ethanol, isopropanol, n-propanol, n-butanol, benzyl alcohol and phenylethyl alcohol. Methanol is particularly preferred. Dimethyl sulphoxide and solvents containing amide groups, such as formamide and dimethylformamide, can also be used. Of course, mixtures of these solvents can also be employed.

If desired, customary polyamide plasticisers (0.2–10% by weight, preferably 0.5–5% by weight, relative to the total quantity of liquid) can be added. As examples, benzenesulphonic acid monoethylamide, p-toluenesulphonic acid amide, dihydroxydiphenyl sulphone and dibenzylphenol may be mentioned.

The total quantity of the salt mixtures to be used according to the invention is preferably 2.5–25% by weight (particularly preferably 5–15% by weight), relative to the quantity of liquid. The proportion of the salts of weak bases should not exceed 30% (relative to the total quantity of salt, which can increase up to the particular solubility limit). Preferably, the proportion of these salts is 0.1–6%, in particular 0.5–3%. The complex compounds according to (b) are generally known (compare EP-A 0,043,485). Suitable examples are palladium complexes of 1,3-diketones and, above all, of 1,3-dienes and $\alpha,\beta$-unsaturated ketones. Those metal complexes (preferably Pd-II complexes) are particularly suitable the organic ligands of which contain, in addition to the groups required for the metal bond, at least one further functional group for anchoring to the substrate surface (compare EP-A 0,081,129).

Coordination complexes of olefines with palladium, which contain the following functional groups, are very particularly suitable: —COOH, —COCl, —COF, —COBr, —CO—O—CO—, $CONH_2$, COO-alkyl, —CO—NH—CO—, —CO— and —NHCO—.

The metal-organic compounds are advantageously employed in the form of their dispersions and in particular their solutions in suitable organic solvents. The concentration should be between 0.01 g and 10 g per litre of solvent. In addition to the solvents mentioned above for the metal salts, low-boiling, inert, water-immiscible types can also be used, for example optionally chlorinated hydrocarbons, such as $HCCl_3$, $CCl_4$, $CH_2Cl_2$, $ClCH=CCl_2$, $Cl_2C=CCl_2$, toluene and many others.

As already mentioned, the salt solutions according to (a) and the complexes according to (b) can in principle be applied to the substrate in any desired sequence, that is to say first (a) and then (b), or first (b) and then (a), or (a) and (b) together. The treatment is in general carried out at a temperature from −15° C. up to the boiling point of the solvents used, preferably at 15°-30° C., for 1-1800 seconds.

A preferred process variant consists in treating the substrate first with the activator solution containing the metal complex and then with the swelling agent system or solvent system.

When carrying out this variant in practice, the procedure advantageously is that the polyamide moulding is (1) immersed at room temperature into the activator solution free of metal salt, (2) removed from the bath after 0.5-10 minutes, preferably 1-5 minutes, (3) then treated for 3-10 minutes at room temperature with the solution of the salt mixture in the polyamide-swelling agent or polyamide solvent, (4) freed from adhering solvent, (5) then transferred into a sensitising bath and (6) finally subjected to electroless metallisation.

The removal of the solvents in step (4) is in general carried out by evaporation, if appropriate under reduced pressure. Higher-boiling solvents are advantageously removed by extraction or by washing with low-boiling solvents.

The sensitisation can in principle be carried out in the customary acid baths based on $SnCl_2$ and $ZnCl_2$ solutions. Preferably, however, it is carried out in alkaline baths with formalin, dimethylborane, sodium borohydride, hydrazine and also sodium hydrogen phosphite. Sensitisation in ammonia-alkaline aqueous alcohol solutions (methanol, ethanol), which contain the abovementioned reducing agents, at room temperature for 1-5 minutes is very particularly preferred.

The sensitised surfaces can be introduced directly or after a washing step (in order to remove residues of reducing agent) into conventional metallising baths.

A very particularly preferred embodiment of the process according to the invention comprises carrying out the reduction in the metallising bath simultaneously by means of the reducing agent or the electroless metallisation. This embodiment represents a simplification, hitherto not possible, of electroless metallisation. This embodiment then consists only of the following working steps: immersion of the substrate into the solution of the complex compound, treatment with the swelling agent system, evaporation of the solvent and immersion of the surfaces thus activated into the metallising bath (reduction and metallisation).

This variant is very particularly suitable for nickel baths containing aminoborane or hypophosphite, or copper baths containing formalin.

The metal deposits produced in this way on the polyamide materials can, if desired, also be strengthened by electroplating. Cu, Ni, Cr, Ag, Au and Pt are above all suitable for this electrical metal deposition. In this case, it is advisable first to carry out prestrengthening by electroplating up to layer thicknesses of about 20 μm in weakly acid or basic electroplating baths, for example in Ni baths at pH 5-6.

The process according to the invention is applicable to all commercially available polyamide types such as polyamide 6, polyamide 6,6, polyamide 10, polyamide 11 and polyamide 12 as well as mixed types. Both polyamides containing fillers and unfilled polyamides can be treated equally successfully. Depending on the proportion, the filler admixtures shorten the required etching time, as compared with the unfilled polyamide.

Furthermore, extremely impact-resistant substrates, such as polyamides grafted on or mixed with rubber, polyisoprene or polybutadiene latices, are outstandingly suitable.

EXAMPLE 1

A glass fibre-reinforced (30%) plastic plate of polyamide 6, of 90×150 mm size and 3 mm thickness, is activated at room temperature (RT) for 1.5 minutes in 0.7 g of 4-cyclohexene-1,2-dicarboxylic acid anhydride-palladium(II) chloride, is dried and is treated for 5 minutes at RT in a bath which contains 1400 ml of methanol (technical)
123 g of $CaCl_2$
2.0 g of $AlCl_3$.

Subsequently, the plate is sensitised for 5 minutes at RT in a bath consisting of 1200 ml of ethanol (technical)
24 ml of $NH_3$ solution (25% strength)
50 ml of 2N DMAB (dimethylaminoborane), rinsed with distilled water and then nickel-plated in a conventional hypophosphite-containing nickel-plating bath for 25 minutes at 30° C. The adhesive strength of the metal deposit, determined by the peel strength according to DIN 53,494, is $\geq 60$ N/25 mm.

The strengthening of polyamide plates by electroplating for the determination of the peel strength is carried out as follows:

(a) pickling in 10% strength $H_2SO_4$ for half a minute
(b) rinsing
(c) 5 minutes in a semi-bright nickel-plating bath at a voltage of 9 volt and a bath temperature of 60° C.
(d) rinsing
(e) pickling for half a minute
(f) 90 minutes in the copper bath; voltage 1.9 volt, bath temperature 28° C.
(g) rinsing.

EXAMPLE 2

In accordance with Example 1, a moulding consisting of a polyamide 6 reinforced with 30% by weight of glass fibres is treated, activated, sensitised, nickel-plated by the chemical method and then strengthened by electroplating. The strengthening by electroplating is carried out as follows:

(a) pickling in 10% strength $H_2SO_4$ for half a minute
(b) rinsing
(c) 5 minutes in a semi-bright nickel-plating bath; voltage 4 volt, bath temperature 60° C., deposited semibright nickel layer: about 4 to 5μ
(d) rinsing
(e) pickling for half a minute
(f) 30 minutes in a copper bath, voltage 1.9 volt, bath temperature 28° C., applied copper layer of 15 to 16μ
(g) rinsing
(h) pickling for half a minute
(i) 8 minutes in a bright nickel bath, voltage 5.5 volt, bath temperature 52° C., deposited nickel layer of about 20μ
(j) rinsing
(k) immersion in oxalic acid (0.5% strength aqueous solution)

(l) 3 minutes in a bright chromium bath, voltage 4.5 volt, bath temperature 40° C., deposited chromium layer about 0.3μ

(m) rinsing (n) decontamination in 40% bisulphide solution (o) rinsing in distilled water.

The moulding thus metallised was subjected to the thermal cycling test according to DIN 53,496, with the hot storage at +110° C. and the cold storage at −40° C. The metal deposit adheres so strongly to the surface of the moulding that it does not show any change.

EXAMPLE 3

In accordance with Example 1, standard rods of a polyamide 6 reinforced with 30% by weight of glass fibres are pretreated, sensitised and chemically nickel-plated. The impact resistance examinations according to DIN 53,453/isoR179 show that their impact resistance is not affected by the entire metallisation process.

EXAMPLE 4

A plastic plate of rubber-grafted polyamide 6, of 90×150 size and 3 mm thickness, is adhesion-activated for 5 minutes at 25° C. in an adhesion-activation solution consisting of 1.0 g of mesityl oxide-palladium chloride
  1400 ml of methanol (technical)
  140 g of $CaCl_2$
  3.0 g of $AlCl_3$
sensitised according to Example 1, rinsed with distilled water, nickel-plated by the chemical method and then strengthened by electroplating in accordance with Example 1. The metal deposit adheres very strongly to the plate surface. Its adhesive strength determined according to DIN 53,494 is 60 N/25 mm.

EXAMPLE 5

A moulding of rubber-modified polyamide 6 is adhesion-activated in accordance with Example 4, sensitised according to Example 1, copper-plated in a commercially available chemical copper-plating bath, strengthened with an electroplated metal deposit in accordance with Example 2 and then three times subjected to the thermal cycling test in accordance with Example 2. The metal deposit adheres to the moulding surface so strongly that it does not show any changes.

EXAMPLE 6

A standard rod of rubber-modified polyamide 6 is adhesion-activated in accordance with Example 4, sensitised or nickel-plated in accordance with Example 1 and then subjected to the impact resistance test according to Example 3. The impact resistance value of both the untreated samples and the nickel-plated samples is 70 $kJ/m^2$.

EXAMPLE 7

A moulding of (rubber-modified) polyamide 6 reinforced with 40% by weight of mineral fibres is adhesion-activated for 5 minutes at 20° C. in an adhesion-activation solution which consists of
  1400 ml of ethanol
  120 g of $CaCl_2$
  5.0 g of $AlCl_3$
  1.5 g of 4-cyclohexene-1,2-dicarboxylic acid anhydride-palladium(II) chloride,
washed, sensitised in accordance with Example 1, nickel-plated and then strengthened by electroplating in accordance with Example 2. The metal deposit adheres so strongly to the surface of the moulding that it passes the thermal cycling test in accordance with Example 2.

EXAMPLE 8

Standard rods are treated in accordance with Example 7, nickel-plated in accordance with Example 1 and then subjected to the impact resistance test in accordance with Example 3. It is found that the impact resistance of the material is not affected. The impact resistance values of nickel-plated and untreated standard rods are >140 $kj/m^2$. The peel strength of the metal deposit is ≧50 N/25 mm.

EXAMPLE 9

A plastic plate of commercially available polyamide 6,6 with 30% by weight of glass fibres, of 90×150 mm size and 3 mm thickness, is treated for 5 minutes at RT in a bath consisting of
  1500 ml of EtOH
  120 g of $CaCl_2$
  20 ml of p-toluenesulphonamide
  3 g of $AlCl_3$
  1.2 g of n-3-hepten-2-one-palladium chloride,
dried at RT and then provided with a metal deposit in accordance with Example 1. This gives a metal/polymer composite material having a high adhesive strength.

EXAMPLE 10

A moulding of rubber-modified polyamide is treated for 6 minutes at 30° C. in a solution of
  700 ml of methanol
  50 ml of n-butanol
  120 g of $CaCl_2$
  2 g of $TiCl_4$,
dried, is activated, sensitised and nickel-plated in accordance with Example 1 and then electroplated in accordance with Example 2. The metal deposit adheres so strongly to the polymer surface that it passes the thermal cycling test according to DIN 53,436.

EXAMPLE 11

A plastic plate of polyamide 6,6 with 40% by weight of glass fibres, of 90×150 mm size and 3 mm thickness, is activated in accordance with Example 1 and treated at RT for 10 minutes in an isopropanol bath which contains, per litre of solution,
  120 g of $MgCl_2$
  2.0 g of $AlCl_3$
  125 ml of distilled $H_2O$.
Subsequently, the plate is sensitised at 30° C. in a bath consisting of
  1000 ml of n-butanol
  10 g of potassium t-butylate
  8 g of aqueous $NH_2$—$NH_2$ solution (30%),
washed, copper-plated in a commercially available copper-plating bath and then strengthened by electroplating in accordance with Example 1. This gives a metal/polymer composite material having a high peel strength.

The notched impact strength value according to DIN 53,453 is not affected by the chemical metallisation process or pretreatment process.

We claim:

1. Process for pretreating substrate surfaces of polyamide mouldings for the electroless metallisation, characterised in that the substrates are treated, in any desired sequence, with
- (a) a solution of a mixture of halides of elements of the 1st and 2nd main groups of the Periodic Table with salts of weak inorganic bases and strong inorganic acids in a non-etching organic swelling agent or solvent for polyamides and
- (b) a metal-organic complex compound of elements of the 1st and/or 8th sub-group of the Periodic Table.

2. Process according to claim 1, characterised in that the substrates are first treated with an activator solution containing the metal-organic complex compounds and then with the solution of the salt mixture.

3. Process according to claim 1, characterised in that the substrates thus treated are introduced directly into the metallising baths.

4. Process according to claim 1, characterised in that a mixture of LiCl, BeCl$_2$, MgCl$_2$ or CaCl$_2$ with FeCl$_2$, FeCl$_3$, TiCl$_3$, TiCl$_4$, BCl$_3$ or AlCl$_3$ is used.

5. Process according to claim 1, characterised in that a mixture of CaCl$_2$ and AlCl$_3$ is used.

6. Process according to claim 1, characterised in that the salt mixture is used in a solution in lower aliphatic or araliphatic alcohols.

7. Process according to claim 1, characterised in that the pretreatment is carried out with a solution of CaCl$_2$ and AlCl$_3$ in methanol.

8. Process according to claim 1, characterised in that the complex compound used is a palladium-II complex of 1,3-dienes or $\alpha,\beta$-unsaturated ketones.

9. Process according to claim 1, characterised in that the complex compound used is an olefine complex of palladium-II, the ligands of which contain, in addition to the groups required for the metal bond, at least one further functional group, such as, for example, —COOH, —COCl, —COF, —COBr, —CO—O—CO—, —CONH$_2$, COO-alkyl, —CO—NH—CO, —CO— and —NHCO—.

10. Process according to claim 1, characterised in that the pretreated substrates are treated in a reducing bath containing aminoborane, hydrazine or formalin.

* * * * *